United States Patent
Furukawa

(10) Patent No.: US 7,671,413 B2
(45) Date of Patent: Mar. 2, 2010

(54) SOI DEVICE WITH REDUCED JUNCTION CAPACITANCE

(75) Inventor: Toshiharu Furukawa, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 11/859,865

(22) Filed: Sep. 24, 2007

(65) Prior Publication Data
US 2008/0006901 A1    Jan. 10, 2008

Related U.S. Application Data

(62) Division of application No. 10/997,597, filed on Nov. 24, 2004, now Pat. No. 7,323,370, which is a division of application No. 10/442,665, filed on Apr. 24, 2003, now Pat. No. 7,009,251, which is a division of application No. 09/681,794, filed on Jun. 6, 2001, now Pat. No. 6,596,570.

(51) Int. Cl.
*H01L 29/76* (2006.01)

(52) U.S. Cl. ............... 257/347; 257/349; 257/406; 257/E27.111

(58) Field of Classification Search ........ 257/347, 257/349, 58, 66, 406, E27.111
See application file for complete search history.

(56) References Cited

U.S. PATENT DOCUMENTS

| 4,717,677 A | 1/1988 | McLaughlin et al. |
| 5,185,280 A * | 2/1993 | Houston et al. ......... 438/163 |
| 5,753,353 A | 5/1998 | Kikuchi |
| 5,759,906 A | 6/1998 | Lou |
| 5,770,881 A | 6/1998 | Pelella et al. |
| 5,777,365 A | 7/1998 | Yamaguchi et al. |
| 5,795,813 A | 8/1998 | Hughes et al. |
| 5,846,858 A | 12/1998 | Kerber |
| 5,866,468 A | 2/1999 | Kono et al. |
| 5,877,046 A | 3/1999 | Yu et al. |
| 5,880,030 A | 3/1999 | Fang et al. |
| 5,918,136 A | 6/1999 | Nakashima et al. |
| 5,930,643 A | 7/1999 | Sadana et al. |
| 5,969,387 A | 10/1999 | Letavic et al. |
| 5,989,966 A | 11/1999 | Huang |
| 6,043,536 A | 3/2000 | Numata et al. |
| 6,045,625 A | 4/2000 | Houston |
| 6,060,364 A | 5/2000 | Maszara et al. |

(Continued)

FOREIGN PATENT DOCUMENTS

JP      07-078994      3/1995

(Continued)

*Primary Examiner*—Michael Trinh
(74) *Attorney, Agent, or Firm*—Schmeiser, Olsen & Watts; Richard M. Kotulak

(57) ABSTRACT

An SOI FET comprising a silicon substrate having silicon layer on top of a buried oxide layer having doped regions and an undoped region is disclosed. The doped region has a dielectric constant different from the dielectric constant of the doped regions. A body also in the silicon layer separates the source/drains in the silicon layer. The source/drains are aligned over the doped regions and the body is aligned over the undoped region. A gate dielectric is on top of the body and a gate conductor is on top of the gate dielectric.

8 Claims, 6 Drawing Sheets

U.S. PATENT DOCUMENTS 6,249,026 B1  6/2001  Matsumoto et al.
6,764,898 B1 *  7/2004  En et al. .................... 438/240

FOREIGN PATENT DOCUMENTS

| JP | 08-130315 | 5/1996 |
| JP | 08-153880 | 6/1996 |
| JP | 2000-340794 A | 12/2000 |

* cited by examiner

SOI DEVICE WITH REDUCED JUNCTION CAPACITANCE

This Application is a division of U.S. patent application Ser. No. 10/997,597, now U.S. Pat. No. 7,323,370 filed on Nov. 24, 2004, which is a division of application Ser. No. 10/422,665 now U.S. Pat. No. 7,009,251 filed on Apr. 24, 2003, which is a division of application Ser. No. 09/681,794 now U.S. Pat. No. 6,596,570 filed on Jun. 6, 2001.

FIELD OF THE INVENTION

The present invention relates to the field of silicon-on-insulator (SOI) field effect transistors (FETs); more specifically, it relates to an SOI FET having reduced junction area capacitance and the method of fabricating said device.

BACKGROUND OF THE INVENTION

In SOI technology, a thin silicon layer is formed over an insulating layer, such as silicon oxide, which in turn, is formed over a substrate. This insulating layer is often referred to as a buried oxide (BOX) layer or simply BOX. Transistor source and drains are formed, for example, by ion implantation of N and/or P dopant into the thin silicon layer with a body region between the source and drain. Gates are formed on top of the body region, for example, by deposition of a gate dielectric and conductor on a top surface of the thin silicon, followed by, photolithographic patterning, and etching.

FETs built in SOI technology have significant advantages over FETs built using bulk silicon technology. Among the advantages of SOI technology are reduced short channel effects, lower parasitic capacitance and increased drain on-current. However, as SOI FET dimensions are downscaled ever smaller to take advantage of, for example, reduced area junction capacitance of downscaled devices increases as the BOX is downscaled (thinned). Increased area junction capacitance causes device performance degradation.

Turning to FIG. 1, FIG. 1 is a partial cross-sectional view of an SOI FET illustrating the various active and parasitic capacitors. FET 100 comprises a silicon substrate 105, a BOX 110 formed on top of the substrate, and a thin silicon layer 115, formed on top of the BOX. FET 100 further comprises source/drains 120 formed in silicon layer 115 and a body region 125, also formed in the silicon layer, separating the source/drains. FET 100 still further comprises a gate dielectric 130, a gate conductor 135, and sidewall spacers 140 formed on sidewalls 145 of gate conductor 135. Extending from a top surface 150 of silicon layer 115, through the silicon layer, to BOX 110 is shallow trench isolation (STI) 155.

The active and parasitic capacitors are located as follows. A front-gate capacitor 160 exists between gate conductor 135 and body region 125. The dielectric for front-gate capacitor 160 is gate dielectric 130. Area junction capacitors 165 exist between each source/drain 120 and substrate 105. A back-gate capacitor 170 exists between body region 125 and substrate 105. The dielectric for area junction capacitors 165 and back-gate capacitor 170 is BOX 110. The capacitance of each of these capacitors is given by the well-known equation:

$$C = \frac{\varepsilon_o \varepsilon_{ox}}{T_{ox}}$$

in which C is the capacitance, $\varepsilon_0$ is the dielectric constant of free space, $\varepsilon_{ox}$ is the dielectric constant of the dielectric and $T_{ox}$ is the thickness of the dielectric. It is desirable for front-gate capacitor 160 to be large in order to increase the on-current and decrease the off-current. This is accomplished by either decreasing the thickness of gate dielectric 130 or by using a material with a high dielectric constant for the gate dielectric. It is desirable for area junction capacitors 165 to be small for reasons described above. However, it is desirable for back-gate capacitor 170 to be large at the same time. The reason a large back-gate capacitor 170 is desirable is to improve off-current control the threshold voltage control. Since the dielectric for area junction capacitors 165 and back-gate capacitor 170 is BOX 110, it is apparent that it is not possible to optimize the area junction capacitors and the back-gate capacitor at the same time.

FIG. 2 is a partial cross-sectional view of a double BOX SOI FET illustrating the various active and parasitic capacitors. The purpose of FIG. 2 is to illustrate that a double BOX SOI device still has the problem described above for a single BOX device. FET 200 comprises a silicon substrate 205, a thick first BOX 210 formed on top of the substrate, a thin first silicon layer 215, which is doped to about $10^{18}$ to $10^{19}$ atm/cm$^3$, formed on top of the first BOX, a thin second BOX 220 formed on top of the first silicon layer and a thin second silicon layer 225 formed on top of the second BOX. FET 200 further comprises source/drains 230 formed in second silicon layer 225 and a body region 235, also formed in the second silicon layer, separating the source/drains. FET 200 still 200 still further comprises a gate dielectric 240, a gate conductor 245, and sidewall spacers 250 formed on sidewalls 255 of gate conductor 245. Extending from a top surface 255 of second silicon layer 225, through the second silicon layer, through second BOX 220, through first silicon layer 215 to first BOX 210 is STI 260.

The active and parasitic capacitors are located as follows. A front-gate capacitor 265 exists between gate 245 and body region 235. The dielectric for front-gate capacitor 265 is gate dielectric 240. Area junction capacitors 270 exist between each source/drain 230 and first silicon layer 215. A back-gate capacitor 275 exists between body region 235 and first silicon layer 215. The dielectric for area junction capacitors 270 and back-gate capacitor 275 is second BOX 220. A substrate capacitor 280 exists between first silicon layer 215 and substrate 205. The dielectric for substrate capacitor 280 is first BOX 210. While first BOX 210 may be thick to reduce the capacitance of substrate capacitor 280, again, since the dielectric for area junction capacitors 270 and back-gate capacitor 275 is second BOX 220, it is not apparent that it is possible to optimize the area junction capacitors and the back-gate capacitor at the same time.

Therefore, a method of fabricating an SOI FET having a small area junction capacitance and a large back-gate capacitance is required in order to obtain all the benefits of SOI technology when downscaling.

SUMMARY OF THE INVENTION

A first aspect of the present invention is a semiconductor structure comprising: a dielectric layer, the dielectric layer having a first and a second region, the first dielectric region having a first dielectric constant and the second dielectric region having a second dielectric constant different from the first dielectric constant.

A second aspect of the present invention is an SOI FET comprising: a silicon substrate having silicon layer on top of a buried oxide layer having doped regions and an undoped region, the undoped region having a dielectric constant different from a dielectric constant of the doped regions; source/ drains in the silicon layer and separated by a body in the silicon layer, the source/drains aligned over the doped regions and the body aligned over the undoped region; and a gate dielectric on top of the body and a gate conductor on top of the gate dielectric.

A third aspect of the present invention is a method of fabricating a semiconductor structure comprising: providing a dielectric layer; forming a first region in the dielectric layer, the first region having a first dielectric constant; and forming a second region in the second dielectric, the second region having a second dielectric constant different from the first dielectric constant.

A fourth aspect of the present invention is a method of fabricating an SOI FET comprising: providing a silicon substrate having silicon layer on top of a buried oxide layer; forming a gate dielectric on top of silicon layer; forming a gate conductor on top of the gate dielectric; forming source/drains in the silicon layer; the source drains separated by a body in the silicon layer, the body aligned under the gate; and forming doped regions in the buried oxide layer, the doped regions aligned under the source /drains and having a dielectric constant different from a dielectric constant of non-doped regions of the buried oxide layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 3A:
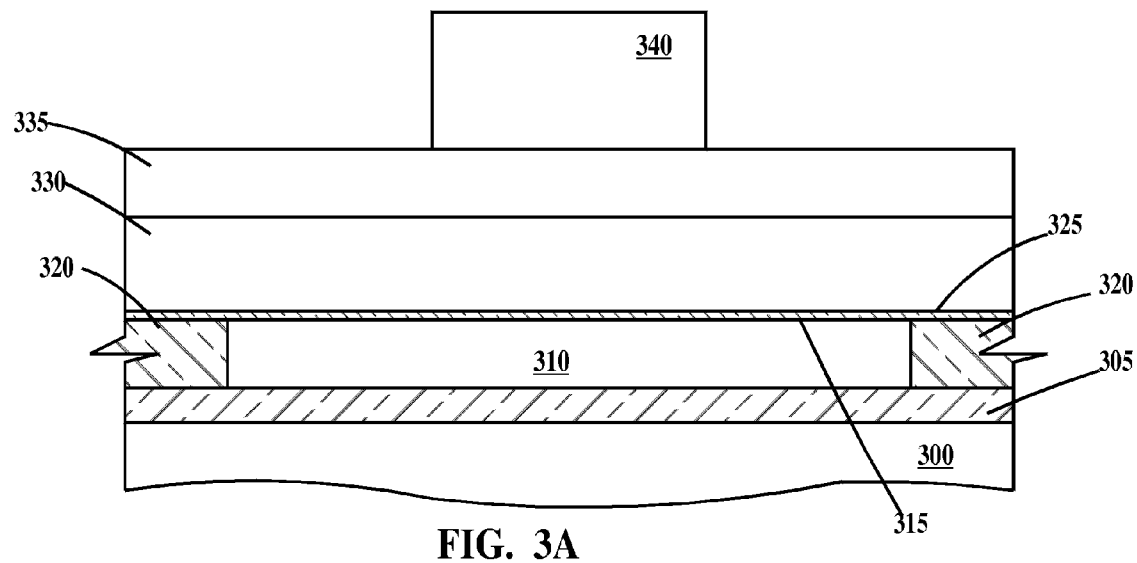
FIGS. 3A through 3E are partial cross-sectional views illustrating the fabrication of an SOI FET according to a first embodiment of the present invention.
Figure 3B:
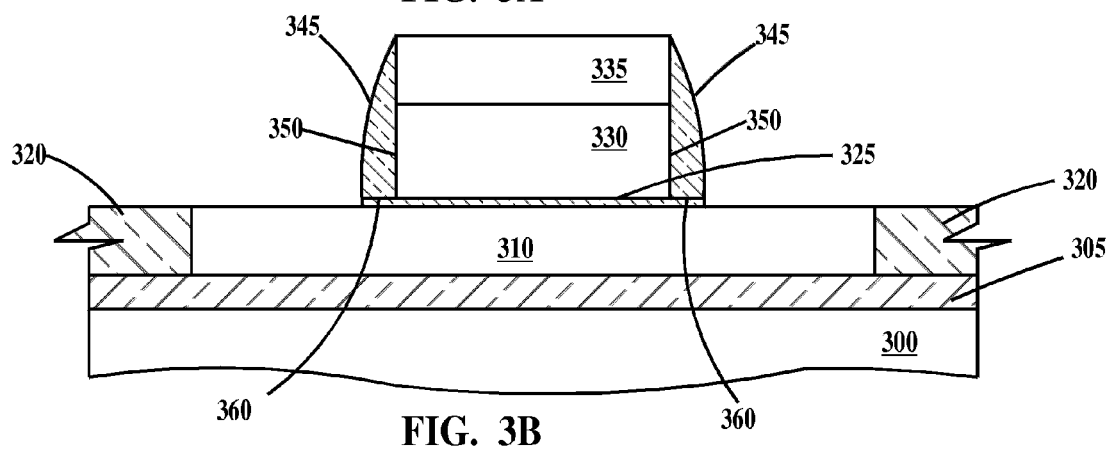
Figure 3C:
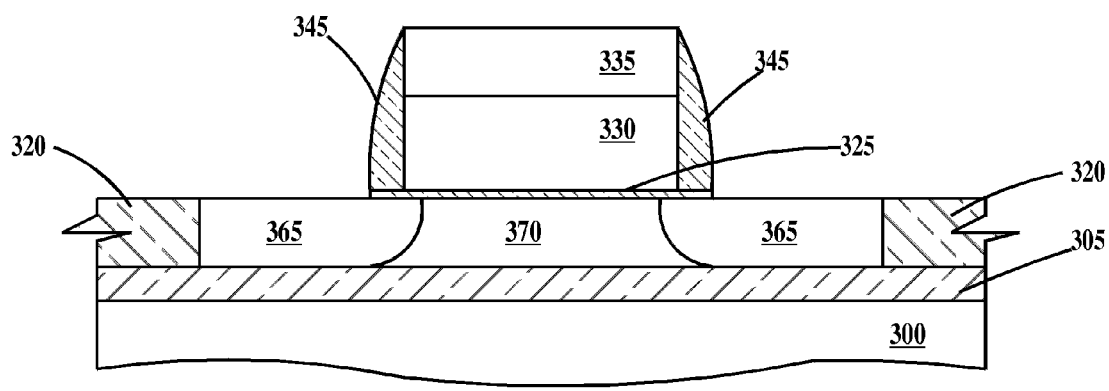
Figure 3D:
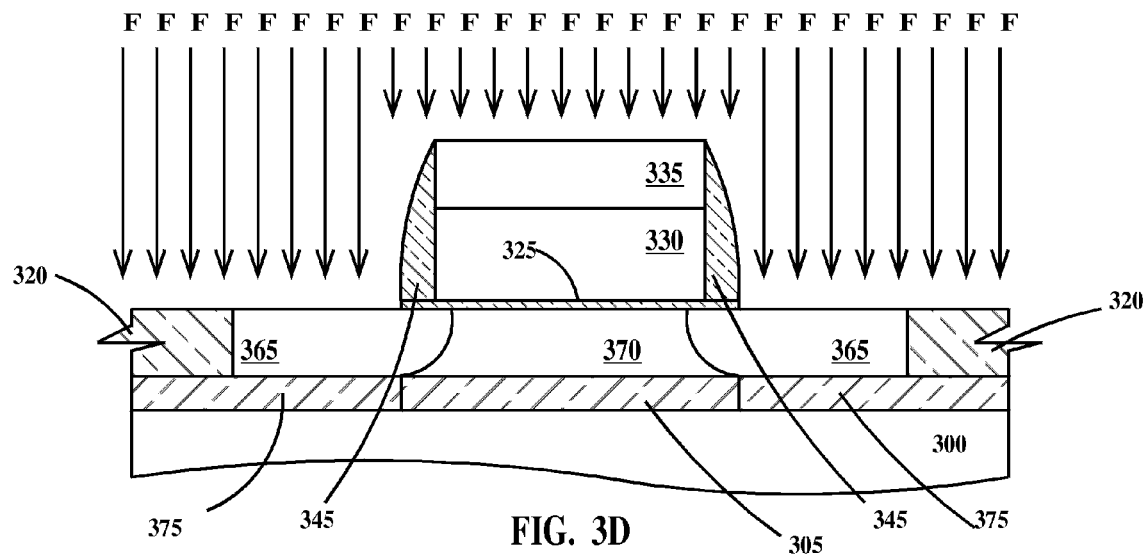

Referring to the drawings, FIGS. 3A through 3E are partial cross-sectional views illustrating the fabrication of an SOI FET device according to a first embodiment of the present invention. The fabrication method starts in FIG. 3A, with a silicon substrate 300 having a BOX 305 formed between a thin silicon layer 310 and the substrate. Extending from a top surface 315 of silicon layer 310, through the silicon layer, to BOX 305 is STI 320. STI 320 may be formed by a photolithographic step, followed by a reactive ion etch (ME) of silicon substrate 300 to form a trench down to BOX 305, followed by deposition of an insulator to fill the trench so formed, followed by a chemical-mechanical-polish (CMP) process to planarize to form top surface 315. In one example, BOX 305 is formed by ion implantation of oxygen and comprises silicon oxide about 50 to 500 Å in thickness, and silicon layer 310 is 50 to 500 Å in thickness being either P or N doped to about $10^{16}$ to $10^{18}$ atm/cm$^3$. Formed on top of top surface 315 is a gate dielectric 325. In one example, gate dielectric 325 is silicon dioxide is formed by thermal or oxidation chemical vapor deposition (CVD) and is about 10 Å to 50 Å in thickness. In another example, gate dielectric 325 is silicon, oxynitride formed by thermal oxidation followed by nitridation of the oxide by remote plasma nitration (RPN) or decoupled plasma nitridation (DPN.) In still another example, gate dielectric 325 is a high-K material such as aluminum oxide or hafnium oxide formed by CVD. Formed on top of gate dielectric 325 is gate conductor 330 and formed on top of the gate conductor is hard mask 335. In one example, gate conductor 330 is polysilicon formed by CVD and is about 500 Å to 2000 Å in thickness and hard mask 335 is silicon oxide, formed by oxidation or CVD, silicon nitride, formed by CVD or a combination thereof. Hard mask 335 is optional and is used to prevent subsequent ion implantation processes, as illustrated in FIG. 3D, and described below from penetrating into gate conductor 330 or gate dielectric 325. Formed on hard mask 335 is photoresist 340. Photoresist 340 is patterned with an FET gate pattern and is aligned over silicon layer 310 between STI 320.

In FIG. 3B, the pattern of photoresist 340 is transferred to gate conductor 330 and hard mask 335 by an RIE process and then the photoresist is removed. Sidewall spacers 345 are formed on sidewalls 350 of gate 330/hard mask 335. Sidewall spacers 345 may be formed by conformal deposition of a dielectric followed by a RIE process. In one example, sidewall spacers 345 are silicon nitride and are about 100 to 2000 Å wide at the sidewall spacer 345/gate dielectric 325 interface 360.

In FIG. 3C, source/drains 365 have been formed in silicon layer 310 by ion implantation of either N or P dopant to a concentration of about $10^{19}$ to $10^{21}$ atm/cm$^3$ followed by a anneal process. Sidewall spacers 345 limit the extension of source/drains 365 under gate 330. The region of silicon layer 310 between source/drains 365 and under gate 330 is now a body region 370. Obviously, for a PFET, source/drain regions 365 are doped P type and body region 370 N type, while for an NFET, source/drain regions 365 are doped N type and body region 370 P type. It should be observed that FIG. 3C illustrates a fully depleted device, but could just as well illustrate a partially depleted device.

In FIG. 3D, a fluorine ion implantation is performed to produce fluorine rich oxide regions 375 in BOX 305. Sidewall spacers 345 limit the extension of fluorine rich oxide regions 375 under gate 330. The fluorine implantation is performed at an energy to place the implantation profile peak within BOX 305 and of sufficient dosage to lower the dielectric constant of BOX 305 by about 5 to 25% after the anneal step illustrated in FIG. 3E and described below. In one example, fluorine is implanted at a dose of about $1\times10^{14}$ to $1\times10^{17}$ atm/cm2 and energies of about 2 to 40 KeV.

Figure 1:
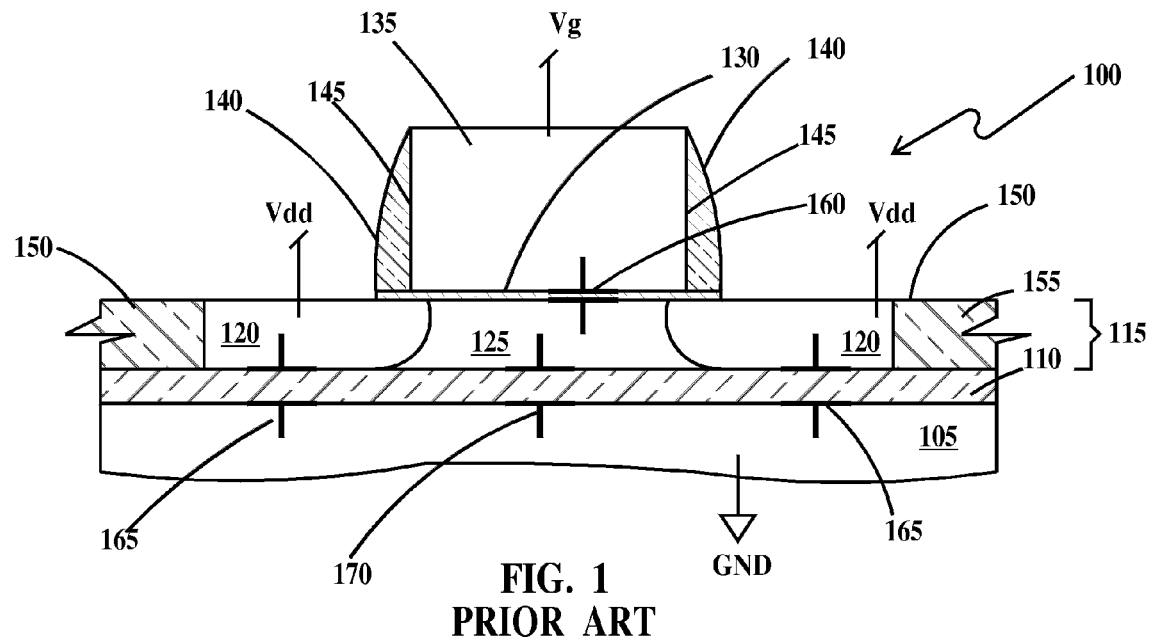
FIG. 1 is a partial cross-sectional view of an SOI FET illustrating the various active and parasitic capacitors.
Figure 3E:
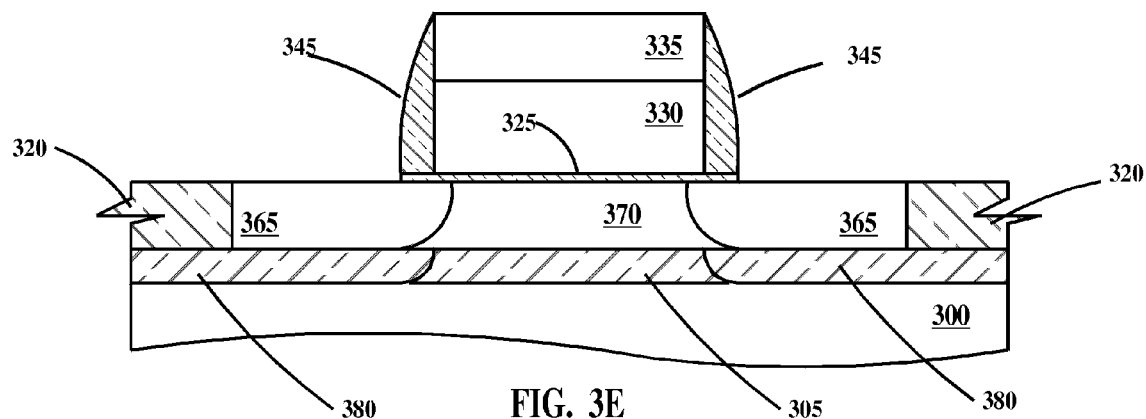

In FIG. 3E, in order to activate the fluorine, an anneal of between 600 to 1000° C. under nitrogen or other inert gas is performed. Activation of the fluorine drives the fluorine into the silicon oxide lattice to produce fluorinated BOX 380. Fluorinated BOX 380 does not extend under body 370 any significant amount. In one example, BOX 305 has a dielectric constant of 3.9 and fluorinated BOX 380 has a dielectric constant of about 3.7 to 2.9. Referring to FIG. 1 and FIG. 3E, since $T_{ox}$ for BOX 305 and fluorinated BOX 380 is the same but $\epsilon_{ox}$ of BOX 305 is higher than $\epsilon_{ox}$ of fluorinated BOX 380 it follows that the capacitance of the area junction capacitors formed from source/drains 365, fluorinated BOX 380 and substrate 300 is lower than the capacitance of the back-gate capacitor formed from body 370, BOX 305 and substrate 300.

Figure 4:
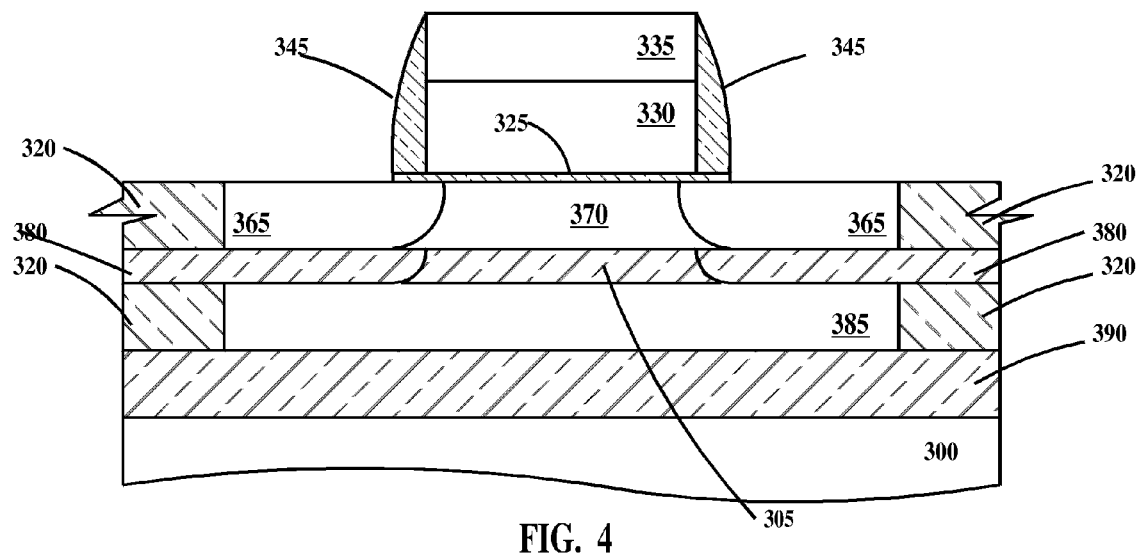
FIG. 4 is a partial cross-sectional view illustrating a double BOX SOI FET fabricated according to the first embodiment of the present invention.

FIG. 4 is a partial cross-sectional view illustrating a double BOX SOI FET fabricated according to the first embodiment of the present invention and is similar to FIG. 3E except for the addition of a second silicon layer 385 under BOX 305 and fluorinated BOX 380 and a second BOX 390 between the second silicon layer and substrate 300. In addition, STI 320 extends through fluorinated BOX 380, through second silicon layer 385 to second BOX 390.

Figure 5A:
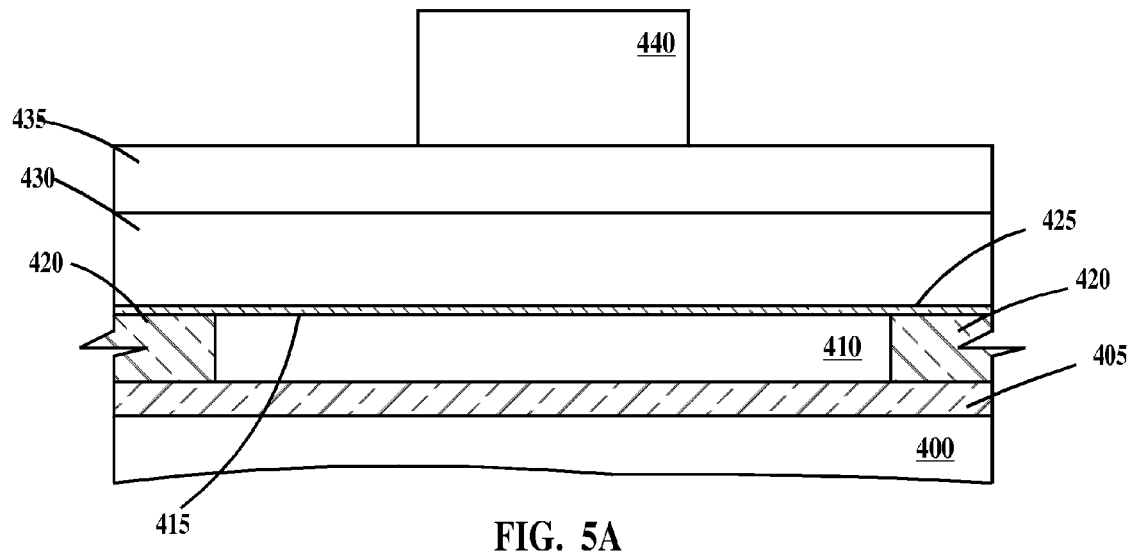
FIGS. 5A through 5F are partial cross-sectional views illustrating the fabrication of an SOI FET according to a second embodiment of the present invention.
Figure 5B:
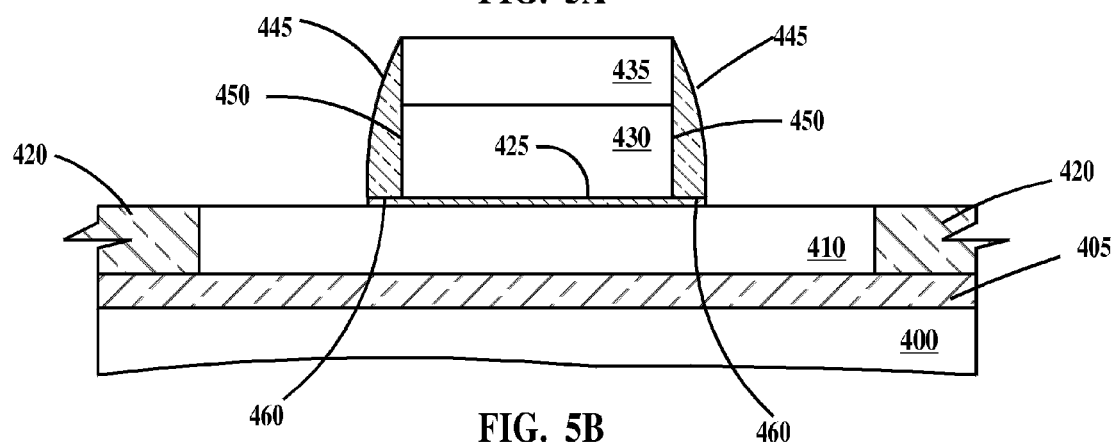
Figure 5C:
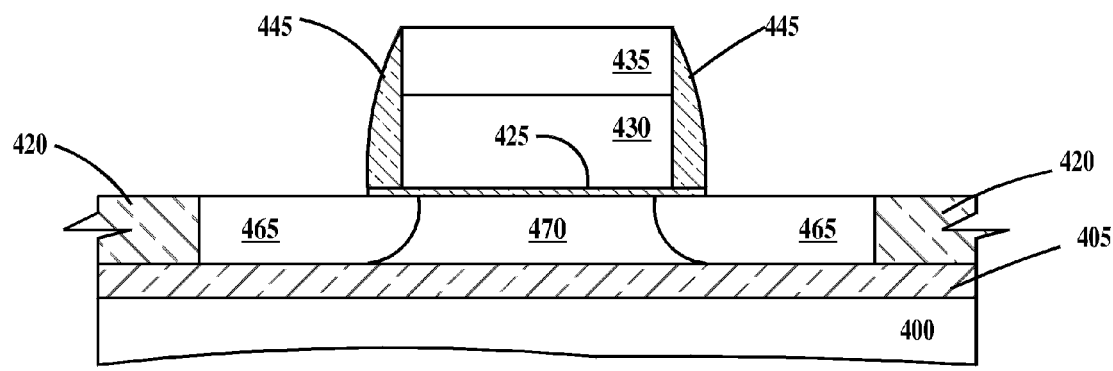
Figure 5D:
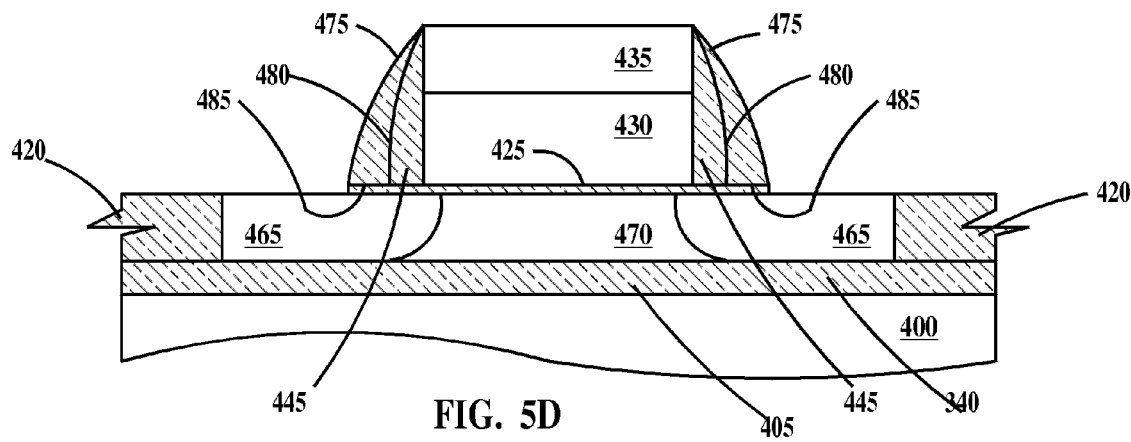
Figure 5E:
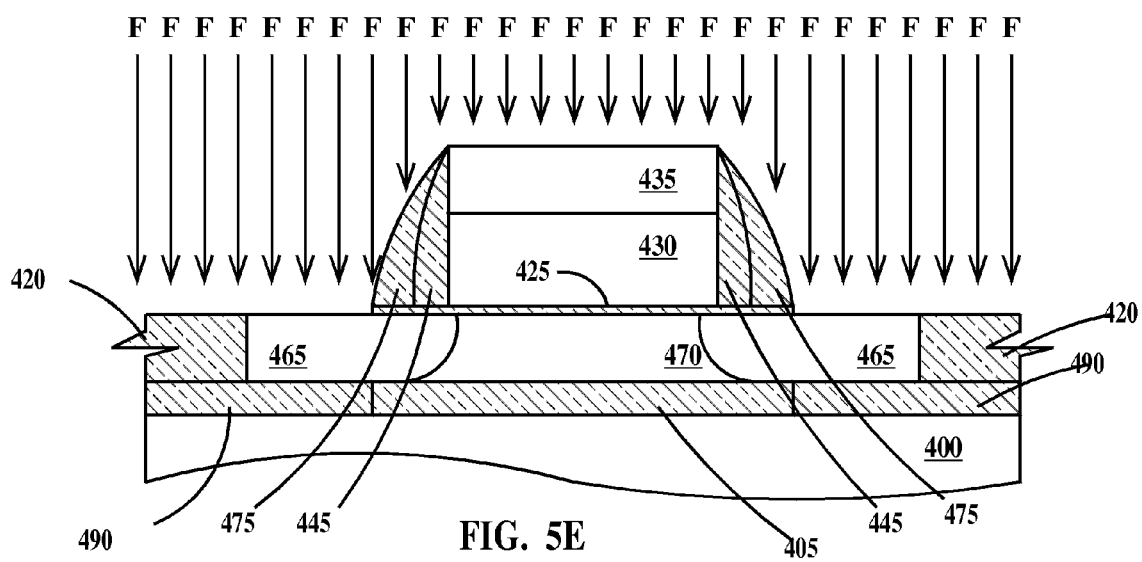

FIGS. 5A through 5F are partial cross-sectional views illustrating the fabrication of an SOI FET according to a second embodiment of the present invention. FIGS. 5A through 5C are similar to FIGS. 3A through 3C described above. The fabrication method starts in FIG. 5A, with a silicon substrate 400 having a BOX 405 formed between a thin silicon layer 410 and the substrate. Extending from a top surface 415 of silicon layer 410, through the silicon layer, to BOX 405 is STI 420. In one example, BOX 405 comprises silicon oxide about 10 to 500 Å in thickness, and silicon layer 410 is 50 to 500 Å in thickness being either P or N doped to about $10^{15}$ to $10^{18}$ atm/cm$^3$. Formed on top of top surface 415 is a gate dielectric 425. In one example, gate dielectric 425 is silicon dioxide about 10 to 50 Å in thickness. Formed on top of gate dielectric 415 is gate conductor 430 and formed on top of gate conductor is hard mask 435. In one example, gate conductor 430 is polysilicon and is about 500 to 2000 Å in thickness and hard mask 435 is silicon oxide, silicon nitride or a combination thereof, and is 100 to 1000 Å in thickness. Hard mask 435 is optional and is used to prevent subsequent ion implantation processes, as illustrated in FIG. 5E, and described below from penetrating into gate conductor 430 or gate dielectric 425. Formed on hard mask 435 is photoresist 440. Photoresist 440 is patterned with an FET gate pattern and is aligned over silicon layer 410 between STI 420.

In FIG. 5B, the pattern of photoresist 440 is transferred into gate conductor 430 and hard mask 435 by an RIE process and then the photoresist is removed. First sidewall spacers 445 are formed on sidewalls 450 of gate 430/hard mask 435. In one example, first sidewall spacers 445 are silicon nitride and are about 10 to 500 Å wide at the first sidewall spacer 445/gate dielectric 425 interface 460.

In FIG. 5C, source/drains 465 have been formed in silicon layer 410 by ion implantation of either N or P dopant to a concentration of about $10^{19}$ to $10^{21}$ atm/cm$^3$ followed by a anneal process. Sidewall spacers 445 limit the extension of source/drains 465 under gate 430. The region of silicon layer 410 between source/drains 465 and under gate 430 is now a body region 470. It should be observed that FIG. 5C illustrates a fully depleted device, but could just as well illustrate a partially depleted device.

In FIG. 5D, second sidewall spacers 475 are formed on sides 480 of first sidewall spacers 445. In one example, second sidewall spacers 475 are silicon nitride and are about 100 to 2000 Å wide at the second sidewall spacer 475/gate dielectric 425 interface 485.

In FIG. 5E, a fluorine ion implantation is performed to produce fluorine rich oxide regions 490 in BOX 405. The fluorine implantation is performed at an energy to place the implantation profile peak within BOX 405 and of sufficient dosage to lower the dielectric constant of BOX 405 by about 5 to 25% after the anneal step illustrated in FIG. 3E and described below. In one example, fluorine is implanted at a dose of about $1\times10^{14}$ to $1\times10^{14}$ atm/cm2 and energies of about 2 to 40 KeV.

Figure 2:
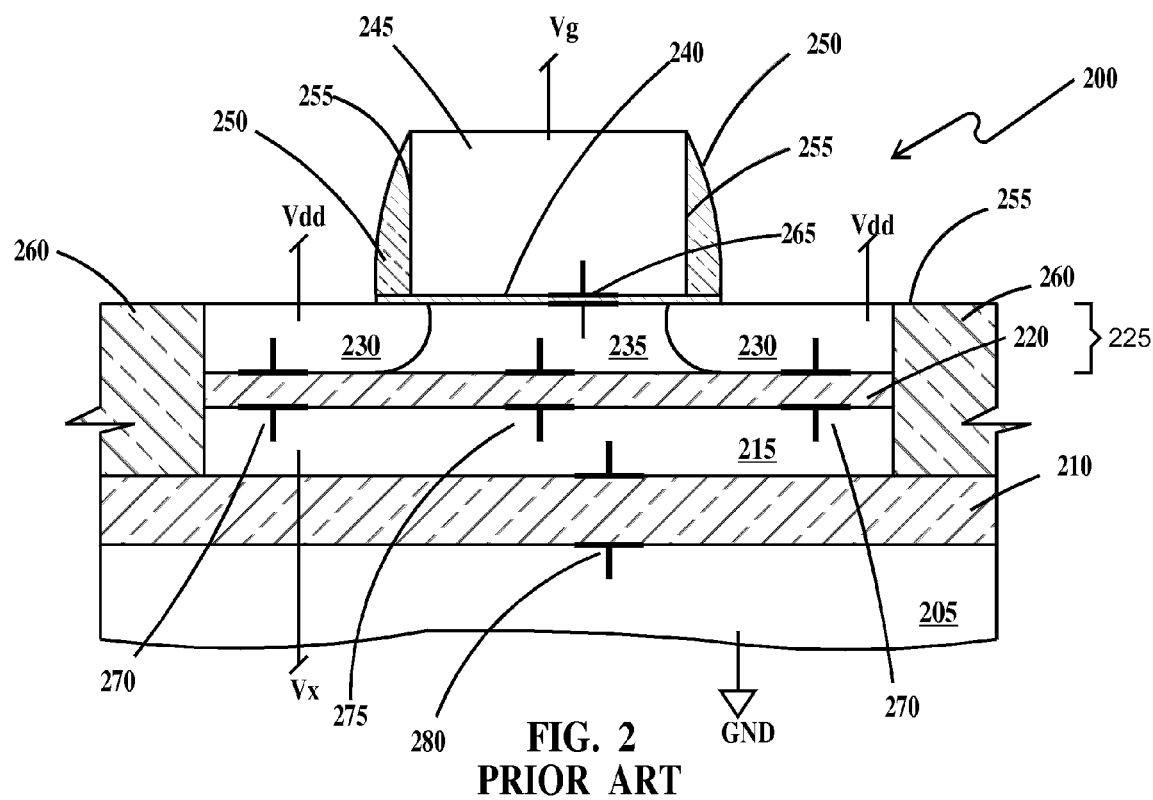
FIG. 2 is a partial cross-sectional view of a double BOX SOI FET illustrating the various active and parasitic capacitors.
Figure 5F:
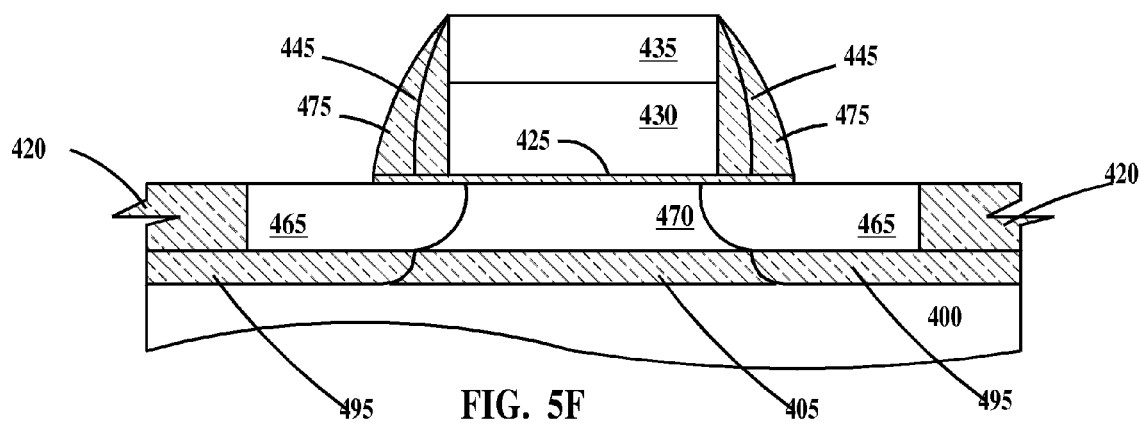

In FIG. 5F, in order to activate the fluorine, an anneal of between 600 to 1000° C. under nitrogen or other inert gas is performed. Activation of the fluorine drives the fluorine into the silicon oxide lattice to produce fluorinated BOX 495. Fluorinated BOX 495 does not extend under body 470 any significant amount. In one example, BOX 405 has a dielectric constant of 3.9 and fluorinated BOX 495 has a dielectric constant of about 3.7 to 2.9. Referring to FIG. 2 and FIG. 5F, since $T_{ox}$ for BOX 405 and fluorinated BOX 495 is the same but $\epsilon_{ox}$ of BOX 405 is higher than $\epsilon_{ox}$ of fluorinated BOX 495 it follows that the capacitance of the area junction capacitors formed from source/drains 465, fluorinated BOX 495 and substrate 400 is lower than the capacitance of the back-gate capacitor formed from body 470, BOX 405 and substrate 400.

Figure 6:
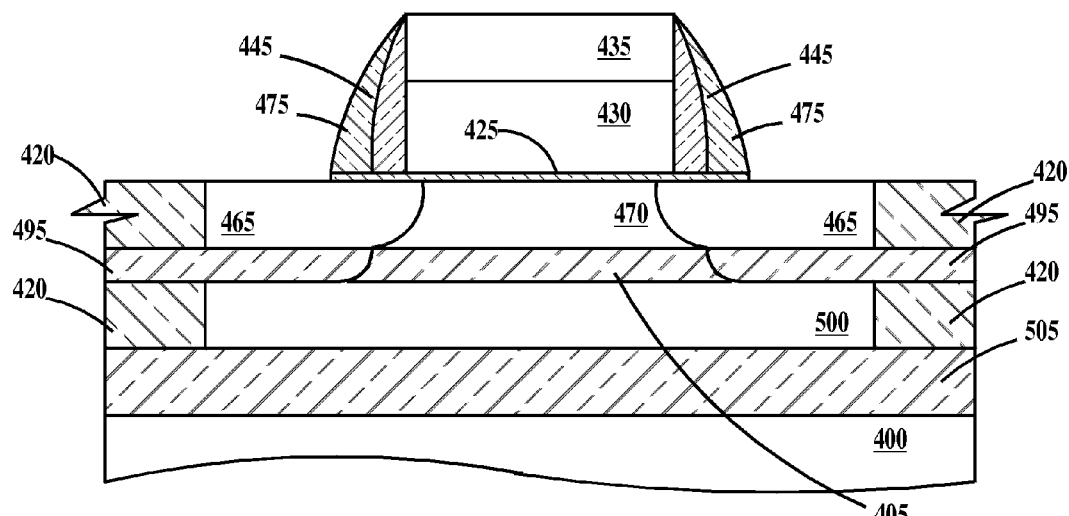
FIG. 6 is a partial cross-sectional view illustrating a double BOX SOI FET fabricated according to the second embodiment of the present invention.

FIG. 6 is a partial cross-sectional view illustrating a double BOX SOI FET fabricated according to the second embodiment of the present invention and is similar to FIG. 5E except for the addition of a second silicon layer 500 under BOX 405 and fluorinated BOX 495 and a second BOX 505 between the second silicon layer and substrate 400. In addition, STI 420 extends through fluorinated BOX 495, through second silicon layer 500 to second BOX 505.

Figure 7:
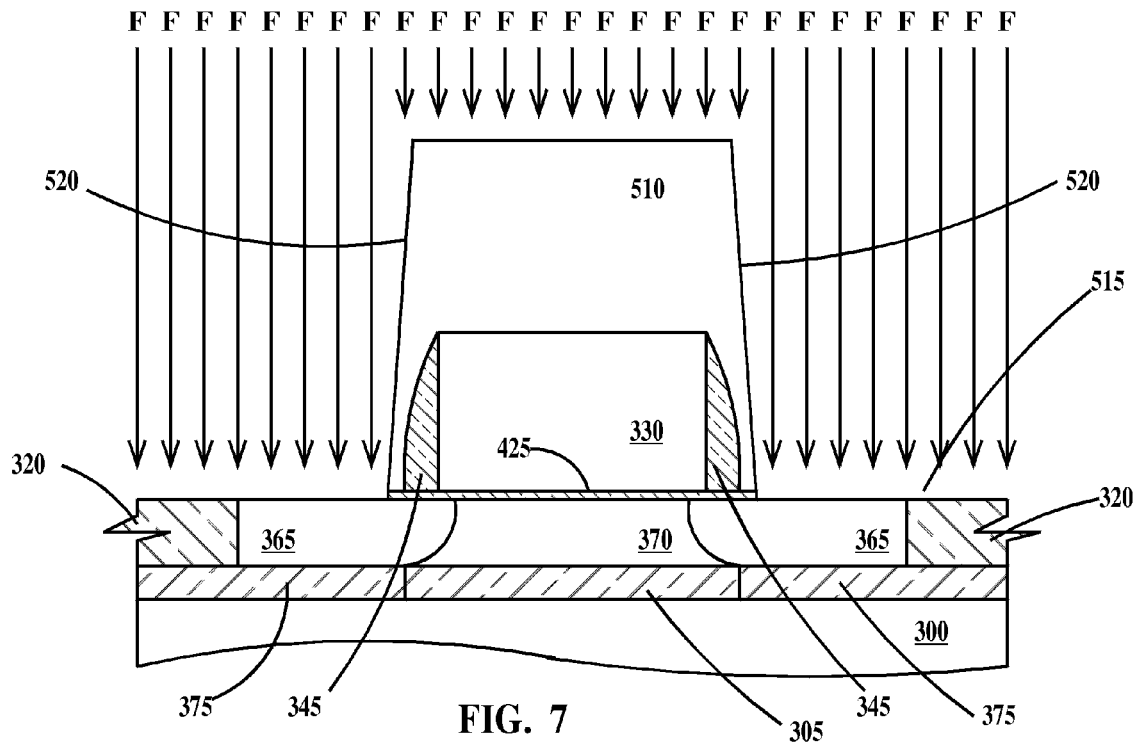
FIG. 7 is a partial cross-sectional view illustrating the fabrication of an SOI FET according to a third embodiment of the present invention.

FIG. 7 is a partial cross-sectional view illustrating the fabrication of an SOI FET according to a third embodiment of the present invention. FIG. 7 is intended to replace the processes illustrated in FIG. 3D and described above. In addition, the steps for forming hard mask 335 are eliminated. In FIG. 7 a second photoresist layer 510 is formed on gate 330 and top surface 515 of gate dielectric 325. Photoresist 510 is patterned with an slightly larger FET gate pattern than was illustrated in FIG. 3A and is aligned such that sidewalls 520 align over source/drains 365 between spacer 345 and STI 320. This embodiment is particularly well suited for large FET devices with long gate lengths.

Sidewalls 520 of second photoresist 510 limit the extension of fluorine rich oxide regions 375 under gate 330. The fluorine implantation is performed at an energy to place the implantation profile peak within BOX 305 and of sufficient dosage to lower the dielectric constant of BOX 305 by about 5 to 25% after the anneal step illustrated in FIG. 3E. In one example, fluorine is implanted at a dose of about $1\times10^{14}$ to $1\times10^{17}$ atm/cm2 and energies of about 2 to 40 KeV.

The description of the embodiments of the present invention is given above for the understanding of the present invention. It will be understood that the invention is not to the particular embodiments described herein, but is capable of various modifications, rearrangements and substitutions will now become apparent to those skilled in the art without departing from the scope of the invention. For example, the invention is applicable to raised source/drain FETs, wherein the fluorine implantation and anneal steps may be performed either before or after the formation of the raised source drain. In addition, the fluorine implant and anneal steps may be performed before source/drains are formed by replacing the gate after the fluorine implant and anneal and then performing source/drain spacer, implantation and anneal steps. Therefore it is intended that the following claims cover all such modifications and changes as fall within the true spirit and scope of the invention.

What is claimed is:

1. A semiconductor structure comprising:
  a silicon substrate having silicon layer on a buried dielectric layer, said buried dielectric layer having a first region between second regions, said first region comprising undoped silicon dioxide and having a first dielectric constant, said second regions comprising fluorine doped silicon dioxide and having a second dielectric constant, second dielectric constant less than said first dielectric constant;

a source, a drain and a body region in said silicon layer, said body region separating said source and said drain;

a gate electrode over and separated from said body region a gate dielectric layer; and said second regions not extending under said body region.

2. The semiconductor structure of claim 1, wherein said second dielectric constant is 5 to 25% less than said first dielectric constant.

3. The semiconductor structure of claim 1, wherein said dielectric layer has a thickness of 50 to 500 Å.

4. The semiconductor structure of claim 1, wherein said second dielectric constant is in a range of 2.9 to 3.7.

5. The semiconductor structure of claim 1, said silicon substrate further comprising:

an additional silicon layer between said buried dielectric layer and an additional buried dielectric layer, said additional buried dielectric layer and said addition silicon layer extending under said silicon layer and said buried dielectric layer.

6. The semiconductor structure of claim 5, further comprising:

a shallow trench isolation (STI) extending through said silicon layer, said buried dielectric layer, and said additional silicon layer to said additional buried dielectric layer, a top surface of said STI coplanar with a top surface of said silicon layer.

7. The semiconductor structure of claim 1, wherein said source and drain contact said buried dielectric layer.

8. The semiconductor structure of claim 1, further comprising:

first sidewall spacers on opposite sides of said gate electrode and second sidewall spacers on said first sidewall spacers.

* * * * *